United States Patent [19]
Frach et al.

[11] Patent Number: 6,063,245
[45] Date of Patent: May 16, 2000

[54] MAGNETRON SPUTTERING METHOD AND APPARATUS UTILIZING A PULSED ENERGY PATTERN

[75] Inventors: Peter Frach, Radeberg; Klaus Goedicke; Michael Junghähnel, both of Dresden; Torsten Winkler, Radeberg; Friedel Haese, Stadecken Elsheim; Dieter W. Meyer, Bad Nauheim; Manfred Müller, Essenheim; Harald Strecker, Bechtholtsheim, all of Germany

[73] Assignee: International Business Machines Corporation, Armonk, N.Y.

[21] Appl. No.: 08/989,246

[22] Filed: Dec. 12, 1997

[30] Foreign Application Priority Data

Dec. 12, 1996 [DE] Germany ............... 196 51 615

[51] Int. Cl.$^7$ ............................. C23C 14/34
[52] U.S. Cl. ............... 204/192.15; 204/192.13; 204/192.16; 204/298.08; 204/298.03; 204/298.16
[58] Field of Search ............ 204/298.12, 298.13, 204/298.08, 192.12, 192.16, 192.15, 192.38, 298.41, 192.13, 298.03, 298.16, 298.26, 298.14; 363/63

[56] References Cited

U.S. PATENT DOCUMENTS

| | | | |
|---|---|---|---|
| 4,610,775 | 9/1986 | Phifer | 204/298.08 |
| 4,902,394 | 2/1990 | Kenmotsu et al. | 204/298.08 |
| 5,104,509 | 4/1992 | Buck et al. | 204/298.41 |
| 5,241,152 | 8/1993 | Anderson et al. | 204/298.08 |
| 5,277,714 | 1/1994 | Tamagaki | 204/298.41 |
| 5,281,321 | 1/1994 | Sturmer et al. | 204/298.41 |
| 5,294,320 | 3/1994 | Somekh et al. | 204/298.08 |

(List continued on next page.)

FOREIGN PATENT DOCUMENTS

| | | | |
|---|---|---|---|
| 0 198 459 | 10/1986 | European Pat. Off. | 204/298.08 |
| 3700633 | 1/1987 | Germany. | |
| 4127317A1 | 8/1991 | Germany. | |
| 4127504A1 | 8/1991 | Germany. | |
| 4202425 | 1/1992 | Germany. | |
| 4223505C1 | 7/1992 | Germany. | |
| 19537212A1 | 6/1995 | Germany. | |
| 2 156 080 | 6/1990 | Japan | 204/298.08 |
| 5-148644A | 6/1993 | Japan | 204/298.08 |
| 2 045 553 | 10/1980 | United Kingdom | 204/298.08 |

OTHER PUBLICATIONS

Lee et al., "Properties of sputter–deposited hydrogenated cargon films as a tribological overcoat used in rigid magnetic disks", Surface and Coatings Technology, copyright 1992, pp. 552–556.

*Primary Examiner*—Nam Nguyen
*Assistant Examiner*—Gregg Cantelmo
*Attorney, Agent, or Firm*—G. Marlin Knight

[57] ABSTRACT

A procedure and apparatus for the application of carbon layers using reactive magnetron sputtering is described. The process includes sputtering of at least two targets made of carbon in a reactive atmosphere with a pulsed energy feed. During a pattern period of the pulses all targets (magnetrons) are once switched on as an anode and at least one target is switched as an anode at all times Various embodiments include detection and limitation of the "microarcs"; executing of regeneration processes according to fixed predetermined time intervals for at least 5 seconds. In one embodiment a microarc is detected on a magnetron and if a next pulse-off time is more than a selected time period away, then the magnetron is connected to a positive pole of the power supply. In another embodiment of the invention a pulsed negative voltage is applied to a substrate being sputtered by connecting the substrate to a negative pole of a pulsed power supply having a positive pole connected to a positive pole of a power supply for a magnetron. In another embodiment of the invention there is an electrode insulated from an installation mass which is connected to at least one positive pole of a power supply during the periodic pausing sputtering of substrates for regeneration.

43 Claims, 2 Drawing Sheets

U.S. PATENT DOCUMENTS

| | | | |
|---|---|---|---|
| 5,346,600 | 9/1994 | Nieh et al. | 204/298.16 |
| 5,507,930 | 4/1996 | Yamashita et al. | 204/192.15 |
| 5,584,972 | 12/1996 | Lantsman | 204/298.08 |
| 5,584,974 | 12/1996 | Sellers | 204/298.08 |
| 5,611,899 | 3/1997 | Maass | 204/298.08 |
| 5,660,700 | 8/1997 | Shimizu et al. | 204/192.13 |
| 5,698,314 | 12/1997 | Goedicke et al. | 204/192.15 |
| 5,777,863 | 7/1998 | Kowalevskii et al. | 363/63 |
| 5,830,331 | 11/1998 | Kim et al. | 204/192.15 |

MAGNETRON SPUTTERING METHOD AND APPARATUS UTILIZING A PULSED ENERGY PATTERN

FIELD OF THE INVENTION

The invention relates to the field of thin film coatings and more particularly to thin film protective layers for magnetic media.

BACKGROUND OF THE INVENTION

For the application of thin carbon layers, different process variants of the basic process of physical and chemical vapor phase precipitation are used. For carbon layers on magnetic fixed disks, for which there are high requirements with regard to smooth surface and the avoidance of particles on the surface, only those procedures which use the principle of magnetron sputtering, i.e. by atomizing the target material in a vacuum, have been able to be carried out until now. In addition, the precipitation rate achieved through magnetron sputtering exceeds the values achieved using other precipitation procedures in a vacuum.

In using carbon layers applied using magnetron sputtering as protective and gliding layers for magnetic disk memories, the required layer characteristics, particularly hardness, abrasion resistance, tribological behavior, corrosion resistance and adhesion for additional lubricant layers to be applied, that is the layers applied subsequently, can be achieved by suitably selection of the hydrogen content of the carbon layers (H. J. Lee et al., Surface and Coatings Technology, 54/55(1992)552–556). Depending on the application, layers will contain, for example, 15 to 30 at percent of hydrogen. The manufacture of these layers therefore takes place in a reactive sputtering process in which the process gas is an argon-hydrogen mix or at least contains hydrogen or hydrocarbon. In this way, the specific electrical resistance of the carbon layers increases with an increase in the hydrogen content. In addition, the layer characteristics are also influenced by other parameters in the sputtering process, such as pressure of the process gas, temperature of the substrate, power density from the target and ion and plasma effects which, for example, can be set through direct voltage on the substrate (voltage distortion).

It is a known procedure to apply DC magnetron sputtering, i.e. to feed the magnetrons with direct current. The disadvantage of this procedure is that instabilities in the process occur with an increase in process time. These are apparent through an increasing tendency to form local arc discharges, called arcing. An effect of arcing can be seen in particles built into the layer and protruding above their surroundings, their size being a multiple of the thickness of the layer. With an increase in storage density and a reduction in the head height, i.e. the distance between the read/write head and the fixed disk, such particles have an increasingly critical effect on functionality. At a storage density of, for example, 1Gbit/inch$^2$ and a head height of below 50 nm, it is understood that particles are generally not permitted, even if their size is clearly below 1 μm.

The formation of arc discharges in reactive sputtering has been known for some time and all types of attempts have been made to prevent them as they lead to a reduction in the layer quality. It has been said that the cause is local areas of high current density on the cathode and a thermal electron emission in areas linked to these areas of high current density. The magnetron discharge reaction in an arc discharge is caused by the electrical discharge of insulating layers, particularly the insulating layers formed in the reactive sputtering process from reaction processes between the target material and the reactive gas. The disruptive electrical discharge of these charged target areas leads to reactions in an arc discharge. This is linked to a drastic fall in the operating voltage, an increase in the current and localization on one or more arc spots and consequently to the melting and splattering of target material. These so-called "catastrophic arcs" lead to the formation of numerous defects in the layer and to damage to the target surface, so that the damaged spot becomes the starting point for new arc discharges.

For the sputtering of carbon, the damaged spots occurring on the target, so-called "nodules" and their negative effects on the stability of the process is described in detail in U.S. Pat. No. 5,507,930.

It is known how to build power supplies for the magnetron so that when a "catastrophic arc" occurs, the energy feed is interrupted for a certain length of time. After switching on the power supply again, the sputtering process generally either continues or an arc discharge is recognized again and the power supply interrupted again. In order to limit the effects of "catastrophic arcs", the DC power supplies are equipped with fast-acting interruption devices, generally in combination with LC switching (DE 195 37 212).

It is additionally known that apart from the occurrence of "catastrophic arcs" which are greatly reduced, additional arc discharges of another type, so-called "microarcs" occur in the reactive sputtering of carbon. These differ from "catastrophic arcs" in that the amount of energy they contain is considerably less and falls in the range of 10 to 100 mWs. In addition, such "microarcs" extinguish themselves without the energy feed being reduced for any time. However, "microarcs" also lead to defects in the layer.

It is also known how to periodically pulse the energy feed for the magnetrons using a certain frequency of, for example, 1 to 100 KHz to prevent arc discharges (DE 41 27 317, DE 37 00 633, DE 41 36 665, DE 42 02 425, DE 41 27 504, DE 42 23 505). In addition to the pulse shaped energy feed, part of this solution also contains the short-circuiting of target and anode. The short-circuit is effected through fast breaker units and is triggered either periodically or after recognizing an arc discharge.

Finally, it is also known how to reduce the probability of arc discharge reactions by the magnetron discharge being fed through a DC voltage source with a sinusoidal alternating voltage superimposed on the DC voltage U.S. Pat. No. 5,507,930.

These known procedures have the disadvantage that in depositing hydrogenous carbon layers using reactive magnetron sputtering, even taking into consideration all the stated process variants, no process for long-term stability can be carried out which leads to low-particle layers. The particle density on the layers increases gradually after a processing time of several hours. The process must be interrupted and the sputtering installation must be ventilated. Numerous irregularities can be seen on the target, generally known as "nodules" or "black flowers". The coating process cannot be restarted until the target has been replaced or cleaned. The uninterrupted process time depends on the requirements in permitted particle density. For the storage density characterized at the start, the ratio between process time and regeneration time is already intolerably low. In addition, there is a high manufacturing risk in that the particle density cannot be determined until the subsequent quality controls. An in-situ quality control for particle density on the carbon layers and, thus, for the stability of the process is not known.

SUMMARY OF THE INVENTION

The invention is a procedure for applying carbon layers by reactive magnetron sputtering. Through different process dependent disturbing arc discharges, so-called "catastrophic arcs" and "microarcs", particles are precipitated. The size and density of these particles, however, delimit the productivity and quality of the coating process. By means of the new process, the size and density of the particles are brought below a definite, very low rate and the sputter process is operated steadily over a long period of time and with a high coating rate.

A procedure and apparatus for the application of carbon layers using reactive magnetron sputtering is described. The process includes sputtering of at least two targets made of carbon in a reactive atmosphere with a pulsed energy feed. During a pattern period of the pulses, all targets (magnetrons) are once switched on as an anode and at least one target is switched as an anode at all times. Various embodiments include detection and limitation of the "microarcs"; executing of regeneration processes according to fixed predetermined time intervals for at least 5 seconds. In one embodiment a microarc is detected on a magnetron and if a next pulse-off time is more than a selected time period away, then the magnetron is connected to a positive pole of the power supply. In another embodiment of the invention a pulsed negative voltage is applied to a substrate being sputtered by connecting the substrate to a negative pole of a pulsed power supply having a positive pole connected to a positive pole of a power supply for a magnetron. In another embodiment there is an electrode insulated from an installation mass which is connected to at least one positive pole of a power supply during the periodic pausing sputtering of substrates.

These carbon layers can be used as protective and gliding layers for the mating of read/write heads and fixed disks of magnetic disk memories.

DETAILED DESCRIPTION OF THE INVENTION

Figure 1:
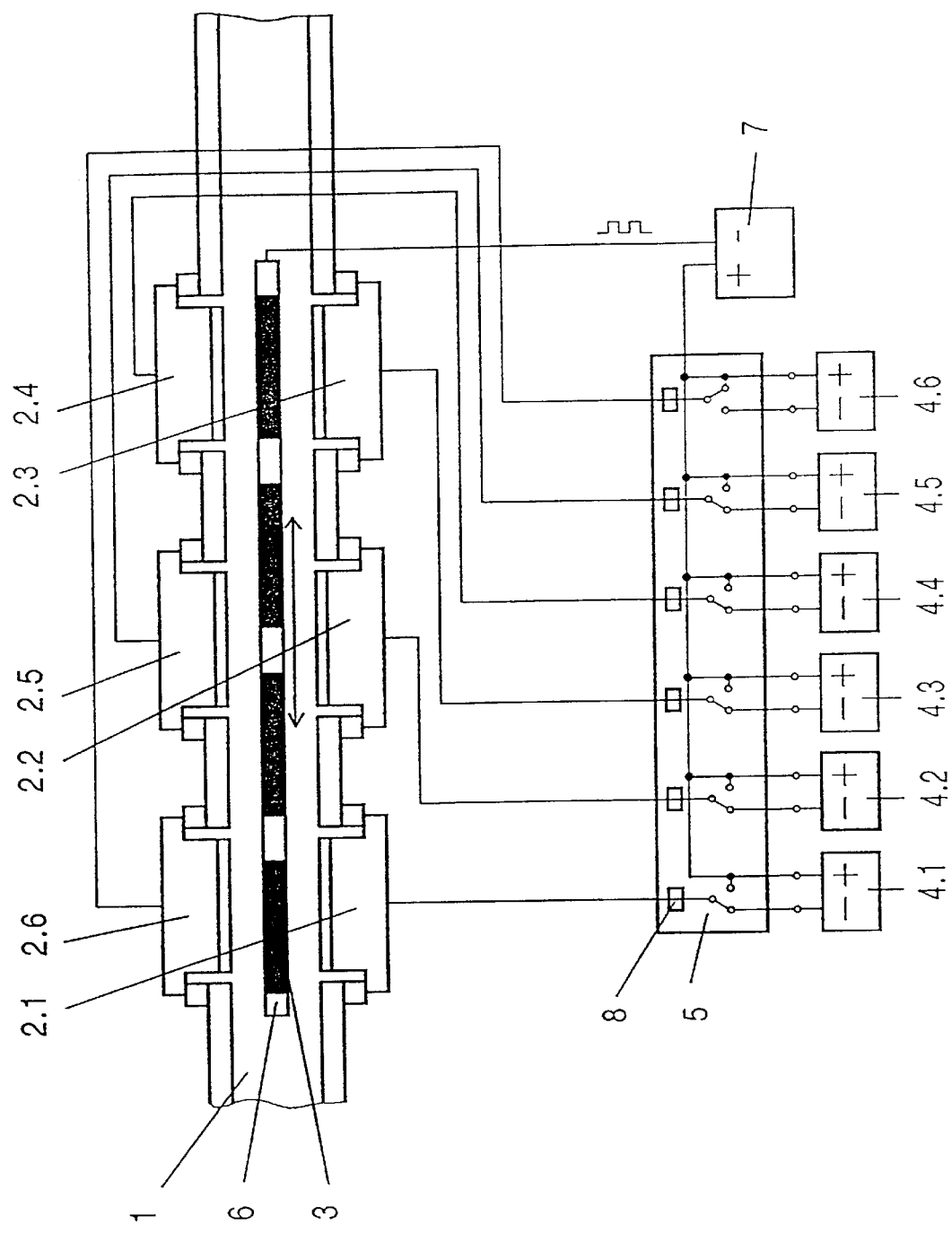
FIG. 1 An arrangement of six magnetrons with targets of carbon in a coating chamber for the two-sided coating of magnetic fixed disks.

The invention is a procedure for applying carbon layers by reactive magnetron sputtering. These types of layers are used as protective and gliding layers. They are used, for example, to guarantee defined frictional behavior and to reduce mechanical wear. In particular, hydrogenous amorphous carbon layers with limited electrical conductivity can be used as protective and gliding layers for the interface between read/write heads and the fixed disks of magnetic disk memories. The procedure is also suited for coating other substrates with carbon, for which protective layers which adhere well and with a high resistance to wear are required.

The invention is based on the task of creating a process for applying carbon layers through reactive magnetron sputtering using a pulse shaped energy feed. In particular, the size and density of particles in the dusted layer should be brought below a definite, very low rate. The sputtering process should be operated steadily over a long period of time and at a high coating rate. The dusted hydrogenous layers should have a high resistance to wear and have adhesive strength. The process should be used for applying sliding and protective layers to substrates, preferably for the mating of read/write heads and the fixed disks of magnetic disk memories.

Through the known process of pulse sputtering, i.e. a pulse shaped energy feed to the magnetrons, "catastrophic Arcs" are already completely avoided, but only in conjunction with the process steps in the invention are additional shortcomings in the known process removed. The process is based on the knowledge that by detecting and monitoring the frequency of "microarcs", a measuring tool is given for the particle density in the carbon layers. In addition, the invention is based on the knowledge that through special measuring of the parameters for a pulse shaped energy feed, conditions in the target area can be maintained, which drastically slow the worsening of the target surface. The manufacture of an electrical short-circuit between the cathode and the positive pole of the current supply for at least 3 $\mu$s is a condition for certain discharge procedures of target areas which are not individually recognized and which potentially fulfill the conditions for the formation of "nodules".

In addition, in the invention the energy content of unavoidable "microarcs" which occasionally occur is limited to less than $10^{-3}$ Ws, in order to avoid a worsening of the target surface. This value clearly lies below all the values achieved by previously known power supplies, but can be realized using known circuit engineering.

In addition, the invention procedure contains a regeneration process which must be at least 5 s and which is started at previously specified fixed time intervals. This regeneration process is carried out as a sputtering process with reduced reactivity, however preferably as a non-reactive sputtering process in pure argon with increased power density on the target surface. During this process phase, no substrate is coated. However, there is an effect on the target surface through the plasma structure and/or phase transformation which removes the conditions under which "microarcs" occur. The frequency of "microarcs" after a regeneration process is vastly reduced.

To carry out the procedure, the frequency of "microarcs" occurring is monitored continually through measurements. The stating of a time interval in the context of detection switching represents an effective means of in-situ quality monitoring for the manufacture of layers sufficiently low in particles.

An additional fundamental characteristic of the invention procedure is that at each point in time at least one of the magnetrons is conductively coupled to the positive poles of the power supply coupled to one another, and thus at times operates as an anode, and that in the periods of pulse shaped energy feed, all magnetrons are switched once as anodes by successive intervals for transferring the positive poles conductively coupled to one another from one magnetron to the next with a time lag $\tau$ of $\tau=(1/nf)\, a_i$, $1<=a_i<n$. In this, n is the number of magnetrons, f is the pulse frequency of the energy feed and $a_i$ is a freely selectable factor associated with magnetron I, which allows it, on the one hand, to set the same time difference $\tau$ for all magnetrons, and on the other hand to set different time differences $\tau_i$ for all magnetrons I, guaranteeing that at least one of the targets always operates as an anode. The magnetrons operating as anodes have an intensive electron emission current applied. This phase is particularly important for reducing the probability of "microarcs" forming.

It has been shown that the size and the density of particles in the carbon layers deposited on the substrate is connected directly with the occurrence of "microarcs" during the coating, but in the procedure in accordance with the invention is kept below a given level.

If several magnetrons are used simultaneously as cathodes for the coating process, then the electron emission current striking on the target of the magnetron operating as an anode can be greater than the electron emission current required. In this case, there is an advantageous embodiment of the process in which, where several magnetrons are employed, the conductively interconnected positive poles of the power supply are conductively connected with the installation mass. In this way a reduction of the electron stream density on the target of the magnetron respectively operating as an anode on the required electron stream is achieved. It can also be useful conductively to couple the positive poles of the power supply conductively coupled to one another with an additional electrode insulated from the installation mass. In doing this, it is advantageous to arrange this electrode in the coating chamber using a shield so that it is exposed to the carbon coating to the smallest possible extent.

To achieve the desired coating characteristics, it is advantageous to arrange the substrate on clamps whose potential compared to the anode potential is set to a negative value of 0 to 200 V, preferably 35V. This voltage can be D.C. voltage. Particular advantages for the coating characteristics are achieved if this voltage on the clamps is also a pulsed DC voltage, with an r.m.s. voltage range as given above.

The procedure for reactively applying a carbon layer using magnetron sputtering is carried out using a gas mixture of argon and hydrogen or argon and a hydrocarbon. To achieve advantageous combinations of mechanical and tribological characteristics in the deposited carbon layers, it is also useful to add an additional part of nitrogen to the reactive mixture.

In addition, it is advantageous to state a critical value for the frequency of "microarcs" occurring in addition to the regeneration processes started at fixed intervals. On these being exceeded, the sputtering process is interrupted and the coating installation is ventilated in order to clean or replace the targets and the parts of the coating chamber around the targets.

The invention procedure will be explained in more detail using a design example. The following figures are shown in the associated drawings:

FIG. 1 An arrangement of six magnetrons with targets of carbon in a coating chamber for the two-sided coating of magnetic fixed disks.

Figure 2:
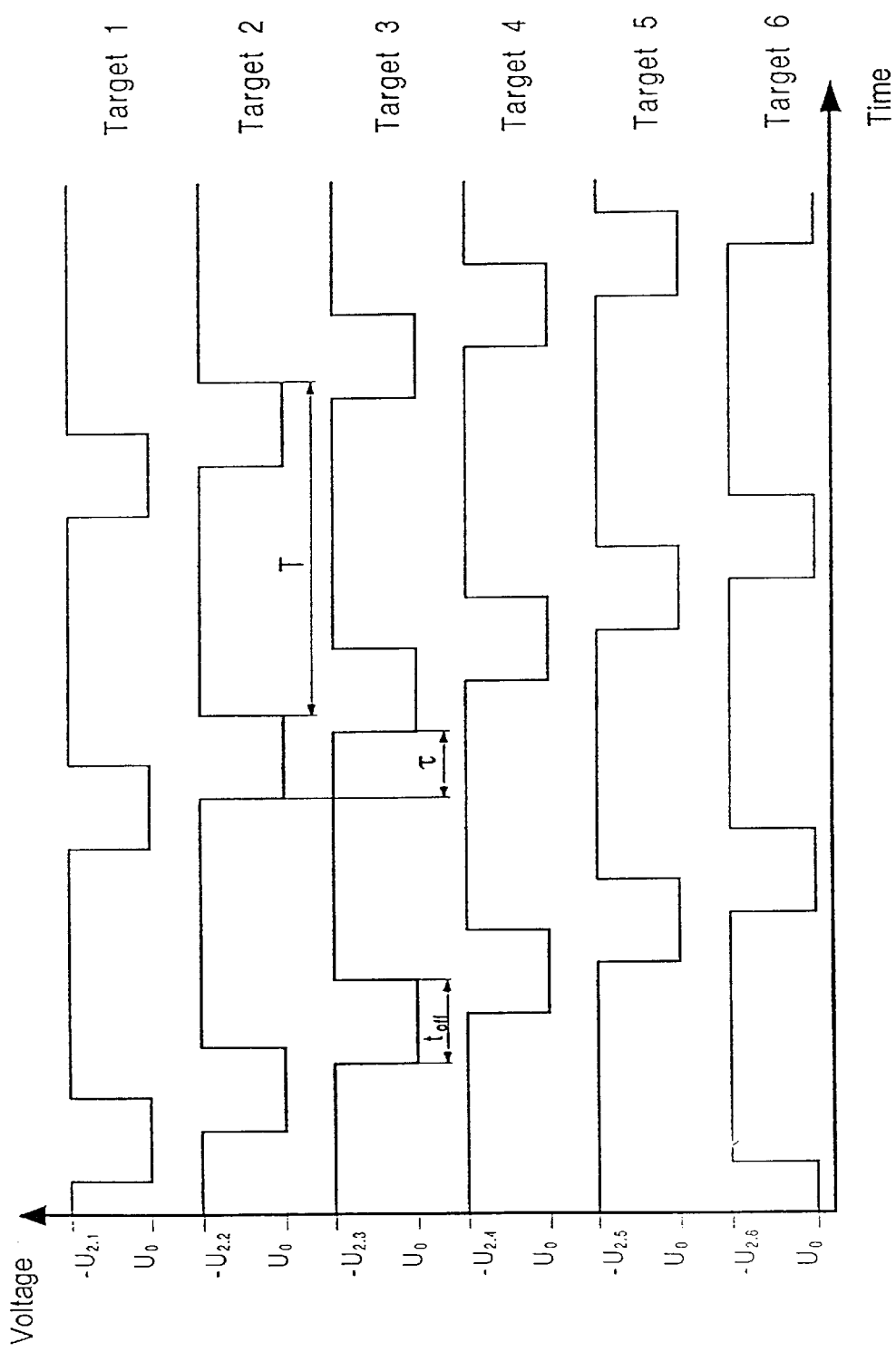
FIG. 2 The voltage over time for the energy feed to a sputtering arrangement with six magnetrons according to FIG. 1.

FIG. 2 The voltage over time for the energy feed to a sputtering arrangement with six magnetrons according to FIG. 1.

Fixed disks for magnetic disk memories are coated in a continuous multi-chamber sputtering installation for two-sided coating.

FIG. 1 shows the coating chamber 1 with three pairs of magnetrons 2.1–2.6, of which three are used for coating one side of the fixed disks 3. Each magnetron 2.1–2.6 is supplied by a power supply 4.1–4.6 allocated to it. A known switching device 5 is used for the pulse-shaped energy feed. The pulse repetition frequency is 50 KHz for each power supply 4.1–4.6. The fixed disks 3 to be coated are arranged in clamps 6 which during the sputtering process move relative to the magnetrons 2.1–2.6. The clamps 6 are insulated from the installation mass. The clamps 6 are connected to the negative pole of a pulse distortion power supply 7 which operates at a pulse frequency of 50 KHz. The positive pole of this power supply 7 is coupled to the poles of the power supplies 4.1–4.6 which are coupled to one another. The difference in potential between the magnetrons 2.1–2.6 and the clamps 6, with regard to the time average, is set to 35V.

During the coating of the fixed disks 3, the composition of the process gas is set as follows: 85% argon, 5% hydrogen, 10% nitrogen. The pressure in the coating chamber 1 is 0.8 Pa and the gas flow is 600 sccm. The coating time for the fixed disks 3, which are arranged respectively on a clamp 6, is 3 min. To carry out the invention procedure, the pulse-shaped energy feed in each magnetron 2.1–2.6 occurs so that the positive poles of all the power supplies 4.1–4.6 are conductively coupled to one another.

At any point in time, these positive poles connected conductively with one another are coupled using the switching device 5 to one of the magnetrons 2.1–2.6 which at this time is operating as an anode for the whole sputtering arrangement. At the point in time shown in FIG. 1, the magnetron 2.6 is short-circuited with the interconnected positive poles of the power supplies 4.1–4.6. Each of the remaining magnetrons 2.1–2.5 is coupled conductively to the negative pole of the respectively allocated power supply 4.1–4.5.

The magnetron discharges arc at a power density of 6 W/cm$^2$. Within a period of time T of 20 $\mu$s given by the pulse repetition frequency of 50 KHz, the energy fed to each of the magnetrons 2.1– 2.6 is interrupted for a time of $t_{off}$=5 $\mu$s, the so-called pulse-off time. In addition, each of the sputtering sources 2.1–2.6 is connected with a device 8 for detecting "microarcs". These devices have a very short response time of about 50 $\mu$s. If a "microarc" is detected, then the device 8 determines the difference from the time of the "microarc" occurring until the start of the next pulse-off time. If this difference is greater than 500 ns, then the respective magnetron 2.1–2.6 is short-circuited within approx. 300 ns to the positive poles of the power supply 4.1–4.6 conductively coupled to one another. This guarantees that the energy content of the "microarc" occurring remains limited to a value below 10$^{-3}$ Ws.

The energy feed to the magnetrons 2.1–2.6 is carried out using the switching device 5 according to a certain plan illustrated in FIG. 2. At each point in time, some of the magnetrons 2.1–2.6 are coupled to the positive poles of the power supply 4.1–4.6 conductively coupled to one another, so that each of the magnetrons 2.1–2.6 operates for the same period as an anode and that a periodic succession for switching over the positive poles of the magnetrons 2.1–2.6 conductively coupled to one another occurs to the next of six magnetrons, the pulse frequency being 50 KHz and the given factor a=1 at a time difference:

$$T = \frac{1}{6*50*10^3 \text{ s}^{-1}} * 1 = 3.3 \text{ }\mu\text{s}$$

The coating of the fixed disks 3 is interrupted at fixed intervals of 24 hours; however the coating chamber 1 is not ventilated. Through a switching procedure, all positive poles of the power supply 4.1–4.6 are coupled to the installation mass. The means of using circuit engineering to limit energy from arc discharges are made ineffective. The reactivity of the process gas in the coating chamber 1 is drastically reduced by pure argon being introduced into the coating chamber 1 and the pressure being changed to 0.2 Pa. The power density is increased by 25% to 7.5 W cm$^{-2}$. Under these conditions, the sputtering process is operated for a period of 4 min. with all magnetrons 2.1–2.6 without fixed disks 3. Thereafter the required operating conditions for the coating process stated above are recreated and the coating of fixed disks 3 is continued. The frequency of occurrence of "microarcs" is thus reduced by a factor of 15.

For a high requirements level for dusted carbon coating characterized by storage density of over 1 Gbit/inch$^2$ in the invention procedure waste is reduced by a factor of 4. By reducing the number of maintenance cycles, the availability of the coating installation is additionally increased by 15%.

What is claimed is:

1. A method for reactive magnetron sputtering of carbon layers in a sputtering system having at least two magnetrons, comprising the steps of:

sputtering from at least two carbon targets in a chamber including a reactive gas; and repeatedly switching electrically conductive connections from two power supplies having positive and negative poles to the magnetrons in a pattern to perform pulse shape sputtering with each magnetron being switched from a positive pole to a negative pole at least once in the pattern and at least one magnetron at all times in the pattern operating as an anode during sputtering by being connected to the positive pole of one of the power supplies.

2. The method of claim 1 further comprising the step of detecting a frequency of microarcs and upon the frequency of microarcs exceeding a critical value, stopping the sputtering process.

3. The method of claim 1 further comprising the step of executing a regeneration process, during which no substrates are coated, according to fixed predetermined time intervals, the regeneration process including reducing the reactive gas.

4. The method of claim 1 further comprising the step of applying a negative voltage to a substrate.

5. The method of claim 4 wherein the negative voltage is a pulsed DC voltage.

6. The method of claim 5 wherein the substrate is connected to a negative pole of a pulsed power supply having a positive pole connected to positive poles of said two power supplies for the magnetrons.

7. The method of claim 1 wherein the reactive gas includes hydrogen or a hydrocarbon.

8. The method of claim 1 wherein the reactive gas includes nitrogen.

9. The method of claim 1 wherein the positive poles are connected together.

10. The method of claim 1 further comprising the step of detecting a microarc on a magnetron and if a next pulse-off time is more than a first time period away, then connecting the magnetron to the positive role of at least one of the two power supplies.

11. The method of claim 1, the step of repeatedly switching the electrically conductive connections to the magnetrons further comprising short-circuiting each magnetron for a period of time in each repetition of the pattern.

12. The method of claim 1, wherein the pattern comprises a sequence of pulses of energy to the magnetrons with no two pulses being closer than a time $\tau_i$, with $$\tau_i = (1/nf)a_i \quad 1 <= a_i < n$$

where n is the number of magnetrons, f is the pulse frequency and $a_i$ is selectable.

13. A method for reactive sputtering of a carbon layer on a substrate comprising the steps of:

pulsing an energy supply of first and second magnetrons having first and second carbon targets, the energy being supplied by at least a first power supply with a positive pole connected to a positive pole of at least a second power supply forming a common positive pole, the pulsing occurring repetitively in a selected pattern with a pulse repetition frequency from 30 KHz to 100 KHz, the selected pattern including a first time period when the first magnetron is operating as an anode by being short-circuited with the common positive pole and a second time period when the second magnetron is operating as an anode by being short-circuited with the common positive pole and the pattern having at least one of the magnetrons operating as an anode at all times and no magnetron which is always an anode;

limiting an energy content of microarcs during sputtering by detecting microarcs and removing power to one or more magnetrons within a selected time after microarcing is detected;

pausing the sputtering periodically at fixed intervals for a period of at least 5 seconds and during said pausing of the energy content microarcs is removed and the sputtering process is reduced in reactivity.

14. The method of claim 13 further comprising the step of pulsing an energy supply of third and fourth magnetrons having third and fourth carbon targets, and the pattern including a third time period when the third magnetron is operating as an a anode by being short-circuited with a common positive pole and a fourth time period when the fourth magnetron is operating as an anode by being short-circuited with the common positive pole and their being at least 3 $\mu$s for each magnetron between every two pulses of the energy.

15. The method of claim 13 wherein an energy content of a microarc on a target is limited to a value below $10^{-3}$ Ws, during sputtering of the carbon layer on the substrate.

16. The method of claim 13 further comprising the step of pulsing an energy supply of third and fourth magnetrons having third and fourth carbon targets, wherein the pattern separates the pulses of the energy of each magnetron with respect to all other magnetrons by at least a time lag $t_i$, with $$t_i = (1/nf)a_i \quad 1 <= a_i < n$$

where f is the pulse repetition frequency and n is the number of magnetrons and $a_i$ is a predetermined factor.

17. The method of claim 13 further comprising applying a negative potential of less than 200 V to a substrate clamp, the negative potential referenced to an anode potential.

18. The method of claim 13 the pausing step further comprising connecting at least one positive pole of a power supply to an electrode insulated from an installation mass.

19. The method of claim 13 further comprising interrupting the sputtering when a frequency of microarcing exceeds a threshold.

20. A sputtering control apparatus for a sputtering system having at least first and second magnetrons and first and second power supplies with positive and negative poles, comprising:

first and second switches with first and second positions, which in the first position connects the negative poles to first and second magnetrons respectively, and which in the second position connects the positive poles to first and second magnetrons respectively;

electrically conductive connections between positive poles of first and second power supplies;

means for controlling first and second switches to repeatedly switch in a pattern the electrically conductive connections to the magnetrons between the negative poles and the positive poles, the pattern having an anode at all times during sputtering; and means for stopping sputtering when frequency of microarcs exceeds a threshold value.

21. The apparatus claim 20 wherein the sputtering system has carbon targets and a reactive gas in a sputtering chamber.

22. The apparatus claim 20 further comprising means for periodically executing a regeneration process.

23. The apparatus claim 20 further comprising means for applying a pulsed negative voltage to a substrate by connecting the substrate to a negative pole of a pulsed power supply having a positive pole connected to the positive pole of the power supply for one of said magnetrons.

24. The apparatus claim 20 further comprising means for detecting a microarc one of said magnetrons and if a next pulse-off time is more than a first time period away, then connecting the magnetron to a positive pole of the power supply.

25. The apparatus claim 24 wherein the means for detecting a microarc limits an energy content of a microarc on a target to a value below $10^{-3}$ Ws, during sputtering.

26. The apparatus claim 20 wherein the pattern comprises a sequence of pulses of energy to the magnetrons with no two pulses being closer than a time $\tau_i$, with $$\tau_i = (1/nf)a_i, 1 <= a_i < n$$

where n is the number of magnetrons, f is the pulse frequency and $a_i$ is selectable.

27. The apparatus of claim 20 further comprising means for pulsing at a repetition frequency from 30 KHz to 100 KHz.

28. A sputtering control apparatus for a sputtering system having at least first and second magnetrons and first and second power supplies with positive and negative poles, comprising:

first and second switches with first and second positions, which in the first position connect the negative poles to first and second magnetrons respectively, and which in the second position connect the positive poles to first and second magnetrons respectively;

electrically conductive connections between positive poles of first and second power supplies;

means for controlling first and second switches to repeatedly switch in a pattern the electrically conductive connections to the magnetrons between the negative poles and the positive poles, the pattern having an anode at all times during sputtering; and means for periodically pausing sputtering and connecting at least one positive pole of a power supply to an electrode insulated from an installation mass.

29. The apparatus claim 28 wherein the sputtering system has carbon targets and a reactive gas in a sputtering chamber.

30. The apparatus claim 28 further comprising means for periodically executing a regeneration process.

31. The apparatus claim 28 further comprising means for applying a pulsed negative voltage to a substrate by connecting the substrate to a negative pole of a pulsed power supply having a positive pole connected to the positive pole of the power supply for one of said magnetrons.

32. The apparatus claim 28 further comprising means for detecting a microarc on one of said magnetrons and if a next pulse-off time is more than a first time period away, then connecting the magnetron to a positive pole of the power supply.

33. The apparatus claim 32 wherein the means for detecting a microarc limits an energy content of a microarc on a target to a value below $10^{-3}$ Ws, during sputtering.

34. The apparatus claim 28 wherein the pattern comprises a sequence of pulses of energy to the magnetrons with no two pulses being closer than a time $t_i$, with $$t_i = (1/nf)a_i, 1 <= a_i < n$$

where n is the number of magnetrons, f is the pulse frequency and $a_i$ is selectable.

35. The apparatus claim 28 further comprising means for pulsing at a repetition frequency from 30 KHz to 100 KHz.

36. A sputtering control apparatus for a sputtering system having at least first and second magnetrons and first and second power supplies with positive and negative poles, comprising:

first and second switches with first and second positions, which in the first position connect the negative poles to first and second magnetrons respectively, and which in the second position connect the positive poles to first and second magnetrons respectively;

electrically conductive connections between positive poles of first and second power supplies;

means for controlling first and second switches to repeatedly switch in a pattern electrical connections to the magnetrons between the negative poles and the positive poles, the pattern having an anode at all times during sputtering; and means for detecting a microarc on one of said magnetrons and if a next pulse-off time is more than a first time period away, then connecting the magnetron to a positive pole of the power supply.

37. The apparatus claim 36 wherein the sputtering system has carbon targets and a reactive gas in a sputtering chamber.

38. The apparatus claim 36 further comprising means for periodically executing a regeneration process.

39. The apparatus claim 36 further comprising means for applying a pulsed negative voltage to a substrate by connecting the substrate to a negative pole of a pulsed power supply having a positive pole connected to the positive pole of the power supply for one of said magnetrons.

40. The apparatus claim 36 further comprising means for periodically pausing sputtering of substrates and connecting at least one positive pole of one of said power supplies to an electrode insulated from an installation mass.

41. The apparatus claim 36 wherein the means for detecting a microarc limits an energy content of a microarc on a target to a value below $10^{-3}$ Ws, during sputtering.

42. The apparatus claim 36 wherein the pattern comprises a sequence of pulses of energy to the magnetrons with no two pulses being closer than a time $t_i$, with $$t_i = (1/nf)a_i, 1 <= a_i < n$$

where n is the number of magnetrons, f is the pulse frequency and $a_i$ is selectable.

43. The apparatus claim 36 further comprising means for pulsing at a repetition frequency from 30 KHz to 100 KHz.

\* \* \* \* \*